United States Patent
Zhang

(10) Patent No.: US 10,312,261 B2
(45) Date of Patent: Jun. 4, 2019

(54) TRANSISTOR WITH SELF-ALIGNED SOURCE AND DRAIN CONTACTS AND METHOD OF MAKING SAME

(71) Applicant: STMicroelectronics, Inc., Coppell, TX (US)

(72) Inventor: John Hongguang Zhang, Fishkill, NY (US)

(73) Assignee: STMicroelectronics, Inc., Coppell, TX (US)

( * ) Notice: Subject to any disclaimer, the term of this patent is extended or adjusted under 35 U.S.C. 154(b) by 0 days.

(21) Appl. No.: 15/890,910

(22) Filed: Feb. 7, 2018

(65) Prior Publication Data

US 2018/0166469 A1    Jun. 14, 2018

Related U.S. Application Data

(60) Continuation of application No. 15/292,465, filed on Oct. 13, 2016, now Pat. No. 9,922,993, which is a
(Continued)

(51) Int. Cl.
*H01L 21/285* (2006.01)
*H01L 21/768* (2006.01)
(Continued)

(52) U.S. Cl.
CPC .... *H01L 27/1211* (2013.01); *H01L 21/28518* (2013.01); *H01L 21/76897* (2013.01);
(Continued)

(58) Field of Classification Search
CPC ......... H01L 21/28518; H01L 21/76897; H01L 21/845; H01L 27/1211; H01L 29/41783;
(Continued)

(56) References Cited

U.S. PATENT DOCUMENTS

| 2005/0112811 A1* | 5/2005 | Hsu | H01L 21/76283 438/197 |
| 2006/0131656 A1* | 6/2006 | Shin | H01L 21/265 257/369 |

(Continued)

FOREIGN PATENT DOCUMENTS

CN    1641846 A    7/2005

OTHER PUBLICATIONS

First Office Action and Search Report for co-pending CN Appl. No. 201511017723.3 dated Aug. 3, 2018 (10 pages).

*Primary Examiner* — Joseph M Galvin, III
(74) *Attorney, Agent, or Firm* — Crowe & Dunlevy

(57) ABSTRACT

A transistor includes an active region supported by a substrate and having a source region, a channel region and a drain region. A gate stack extends over the channel region and a first sidewall surrounds the gate stack. A raised source region and a raised drain region are provided over the source and drain regions, respectively, of the active region adjacent the first sidewall. A second sidewall peripherally surrounds each of the raised source region and raised drain region. The second sidewall extends above a top surface of the raised source region and raised drain region to define regions laterally delimited by the first and second sidewalls. A conductive material fills the regions to form a source contact and a drain contact to the raised source region and raised drain region, respectively.

18 Claims, 16 Drawing Sheets

Related U.S. Application Data division of application No. 14/821,845, filed on Aug. 10, 2015, now Pat. No. 9,496,283.

(51) Int. Cl.
*H01L 27/12* (2006.01)
*H01L 29/417* (2006.01)
*H01L 21/84* (2006.01)
*H01L 29/66* (2006.01)

(52) U.S. Cl.
CPC ...... *H01L 21/845* (2013.01); *H01L 29/41783* (2013.01); *H01L 29/6656* (2013.01); *H01L 29/66628* (2013.01); *H01L 29/665* (2013.01)

(58) Field of Classification Search
CPC ............... H01L 29/665; H01L 29/6656; H01L 29/66628
See application file for complete search history.

(56) References Cited

U.S. PATENT DOCUMENTS

| | | |
|---|---|---|
| 2008/0079094 A1 | 4/2008 | Jin et al. |
| 2013/0065371 A1 | 3/2013 | Wei et al. |
| 2013/0240990 A1 | 9/2013 | Yin et al. |
| 2013/0309831 A1 | 11/2013 | Yin et al. |
| 2014/0117420 A1 | 5/2014 | Chen et al. |
| 2016/0358908 A1 | 12/2016 | Xie et al. |

* cited by examiner

TRANSISTOR WITH SELF-ALIGNED SOURCE AND DRAIN CONTACTS AND METHOD OF MAKING SAME

CROSS REFERENCE TO RELATED APPLICATIONS

This application is a continuation of U.S. application patent Ser. No. 15/292,465 filed Oct. 13, 2016, which is a divisional application from U.S. application patent Ser. No. 14/821,845 filed Aug. 10, 2015, now U.S. Pat. No. 9,496,283, the disclosures of which are incorporated by reference.

TECHNICAL FIELD

The present invention relates to the fabrication of integrated circuits and, more particularly, to a process for the formation of integrated circuit transistor devices with self-aligned source and drain contacts.

BACKGROUND

As the technology node continues to shrink to produce smaller and smaller integrated circuit transistor devices, it is becoming increasingly challenging to fabricate and make electrical contact to the terminals of each transistor device. One concern is preventing the inadvertent formation of a short between the transistor gate and the transistor source-drain regions when using raised source-drain epitaxial regions. Another concern is preventing the inadvertent formation of a short between adjacent active regions. Circuit designers must include sufficient spacing between devices to avoid the risk of shorting, but this solution comes at the expense of increased surface area. This area penalty can be especially problematic in designs which utilize unmerged source-drain structures for adjacent transistor devices.

A need accordingly exists in the art for an improved process for fabricating transistor devices that can address concerns with source-drain epitaxial shorting, self-alignment of source-drain contacts while maintaining reduced contact resistance, and the formation of source-drain contacts self-aligned to the gate.

SUMMARY

In an embodiment, a method comprises: forming an intermediate transistor structure including: a gate structure having a first vertical dielectric spacer on a first sidewall of the gate structure and having a second vertical dielectric spacer on a second sidewall of the gate structure, a source region adjacent the gate structure such that at least part of the first vertical dielectric spacer is located between the source region and the gate structure; and a drain region adjacent the gate structure such that at least part of the second vertical dielectric spacer is located between the source region and the gate structure; wherein the top surface of the gate structure is at a level that is higher than and not coplanar with a top surface of the source region and a top surface of the drain region; forming a sacrificial layer over the source region and the drain region so that a top surface of the sacrificial layer is substantially coplanar with the top surface of the gate structure; forming a gate structure block mask over a portion of the gate structure, such that the gate structure block mask is not over at least a majority of the source region and the drain region; forming a source/drain mask over the source region and the drain region adjacent the gate structure block mask; while forming the source/drain mask, exposing a third sidewall and a fourth sidewall of the gate structure, wherein the third and fourth sidewalls are not parallel to nor aligned with the first and second sidewalls of the gate structure; forming a third vertical dielectric spacer on any exposed sidewalls of the source region, on any exposed sidewalls of the drain region, on the third sidewall of the gate structure, and on the fourth sidewall of the gate structure; selectively removing the source/drain mask; selectively removing the sacrificial layer remaining on the source and drain regions; forming source and drain contact structures on the source and drain regions at the locations where the remaining sacrificial layer was removed.

In an embodiment, a method comprises: forming a gate structure that includes a first sidewall and a second sidewall; forming a first vertical dielectric spacer on the first sidewall and a second vertical dielectric spacer on the second sidewall; forming a source region adjacent the gate structure with at least part of the first vertical dielectric spacer located between the source region and the gate structure; forming a drain region adjacent the gate structure with at least part of the second vertical dielectric spacer located between the source region and the gate structure; providing a sacrificial layer over the source region and the drain region, the sacrificial layer having a top surface that is substantially coplanar with a top surface of the gate structure and the first and second vertical dielectric spacers; forming a gate structure block mask that extends over the gate structure and the first and second vertical dielectric spacers; forming a source/drain mask on the dummy layer over the source region and the drain region adjacent the gate structure block mask; while forming the source/drain mask, exposing a third sidewall and a fourth sidewall of the gate structure, wherein the third and fourth sidewalls are not parallel to nor aligned with the first and second sidewalls of the gate structure; forming a third vertical dielectric spacer on any exposed sidewalls of the source region, on any exposed sidewalls of the drain region, on any exposed sidewalls of the source/drain mask, on any exposed sidewalls of the gate structure block mask, on the third sidewall of the gate structure, and on the fourth sidewall of the gate structure; selectively removing the source/drain mask and the sacrificial layer to form openings over the source and drain regions that are delimited by the first, second and third vertical dielectric spacers; and filling said openings with a conductive material to form source and drain contact structures.

In an embodiment, a method comprises: forming an intermediate transistor structure including: an active region supported by a substrate and including a source region, a channel region and a drain region; and a gate stack over the channel region; forming a first sidewall spacer on sidewalls of the gate stack; epitaxially growing a raised source region and a raised drain region over the source and drain regions, respectively, of the active region and adjacent the first sidewall spacer; depositing a sacrificial layer over the raised source region and raised drain region to form a source stack and a drain stack, respectively; forming a second sidewall spacer on further sidewalls of the gate stack and which peripherally surrounds the source stack and drain stack; selectively removing the sacrificial layer to form openings above the raised source region and raised drain region that are each delimited by the first and second sidewall spacers; and filling said openings with conductive material to form a source contact and a drain contact to the raised source region and raised drain region, respectively.

In an embodiment, a method comprises: forming an intermediate transistor structure including: an active region supported by a substrate and including a source region, a channel region and a drain region; and a gate stack over the channel region; forming a first sidewall spacer on first sidewalls of the gate stack; forming a raised source region and a raised drain region over the source and drain regions, respectively, of the active region and adjacent the first sidewall spacer; depositing a sacrificial layer over the raised source region and raised drain region; forming a first mask over the gate stack; forming a second mask over the sacrificial layer and the raised source region and raised drain region; etching using the first and second masks to define a source stack and drain stack covered by said second mask and expose second sidewalls of the gate stack; forming a second sidewall spacer on the second sidewalls and which surrounds the source stack and drain stack; removing the second mask; etching using the first mask to remove the sacrificial layer and form openings above the raised source region and raised drain region which are delimited by the first and second sidewall spacers; and filling said openings with conductive material to form a source contact and a drain contact to the raised source region and raised drain region, respectively.

BRIEF DESCRIPTION OF THE DRAWINGS

For a better understanding of the embodiments, reference will now be made by way of example only to the accompanying figures in which.

DETAILED DESCRIPTION

Reference is now made to FIGS. 1-15 showing process steps for the formation of an integrated circuit transistor device. It will be understood that the illustrations provided do not necessarily show the features drawn to scale.

The process starts with a silicon on insulator (SOI) substrate 10 wafer of a conventional type (comprising, for example, an extremely thin silicon on insulator (ETSOI) or an ultra-thin body and buried oxide (UTBB) silicon on insulator (SOI) known to those skilled in the art). The top semiconductor layer 12 (thickness 1-80 nm) of the SOI substrate 10 may be silicon doped as appropriate for the integrated circuit application. In an embodiment, the top semiconductor layer may be of the fully depleted (FD) configuration. The top semiconductor layer 12 is supported by a buried oxide layer 14 (thickness 2-200 nm), with the buried oxide layer supported by a semiconductor substrate layer 16.

Figure 1:
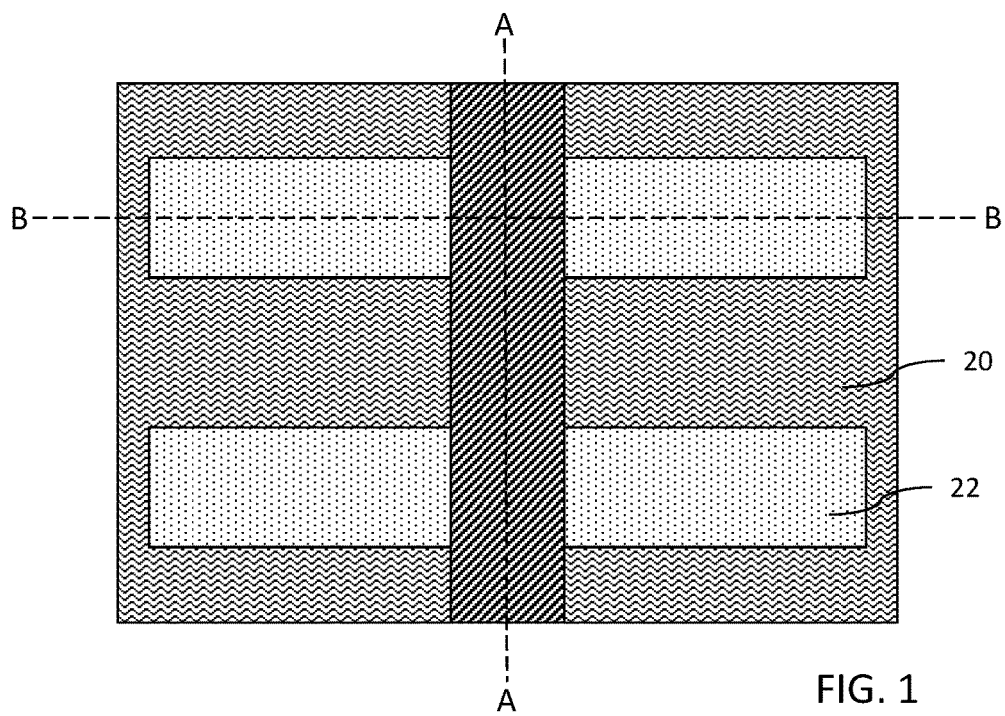
FIGS. 1-15 show process steps for the formation of an integrated circuit transistor device.
Figure 1A:
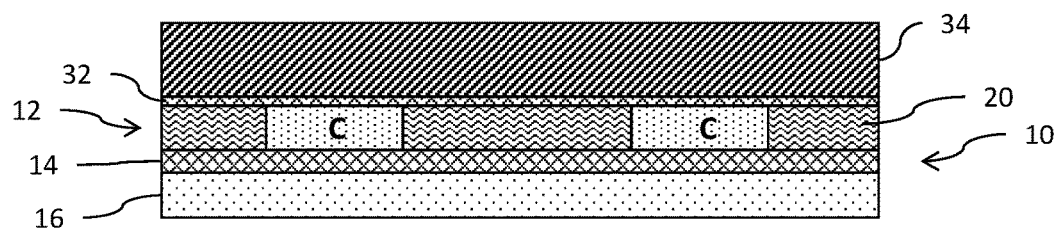
Figure 1B:
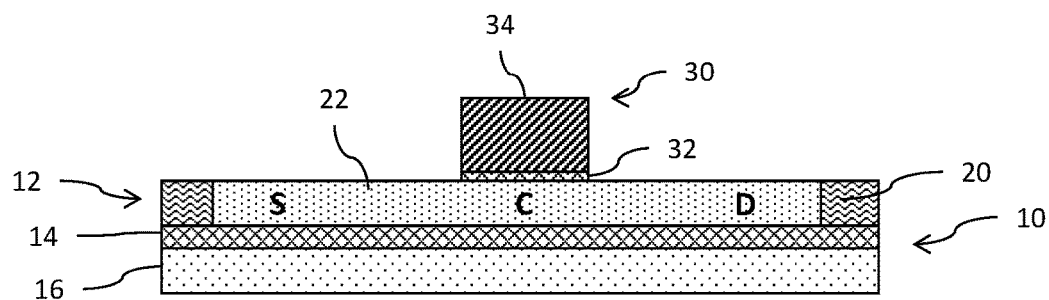

FIG. 1 shows a top view of a portion of the wafer, with FIG. 1A showing a cross-section taken along line A-A and FIG. 1B showing a cross-section taken along line B-B. This relationship between the top and cross-sectional views is consistent among the figures.

Using patterned etch and fill techniques well known in the art, shallow trench isolation (STI) structures 20 are formed in the top semiconductor layer 12 to delimit active regions 22 formed from the semiconductor material of the top semiconductor layer 12. The active regions 22 may, for example, have a width of 5-40 nm and be arranged with a pitch of 10-80 nm. Any suitable length for the active regions dependent on application may be supported. In an alternative embodiment, the active regions 22 may comprise fin structures such as those known in the art for use in fabricating finFET transistors. The fin structures may be separated from each other by the STI structures, but such fin structures will typically have a height that extends above the top surface of the STI structures.

A layer of a high-K dielectric material (thickness 2-20 nm) and a layer of a polysilicon material (thickness 5-120 nm) are deposited over the wafer. Using conventional lithographic processing techniques, these layers are patterned to form a gate stack 30 comprising a gate dielectric 32 and a gate electrode 34 that crosses over the active region 22 at the location of a channel region (C) for the transistor being formed. The source region (S) and drain region (D) for the transistor are provided in the active region 22 on either side of the channel region. Although polysilicon is shown as the material for the gate electrode 34, it will be understood that this is by example only and that the gate electrode may comprise other conductive or semiconductive materials and may be formed of plural layers of conductive or semiconductive materials. The gate stack 30 may, for example, have a width that extends across multiple active regions 22 and a length of 5-40 nm.

In situations where the gate stack 30 is a "dummy" gate of the type known for use in replacement metal gate fabrication techniques, the layers 32 and 34 may be replaced by a single layer of polysilicon or other suitable material that is patterned to define the gate region.

Figure 1C:
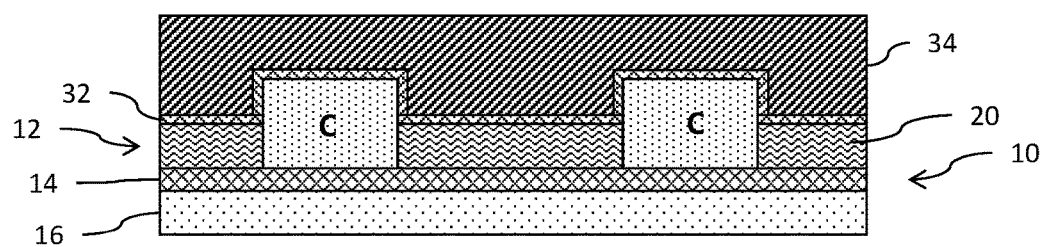
Figure 1D:
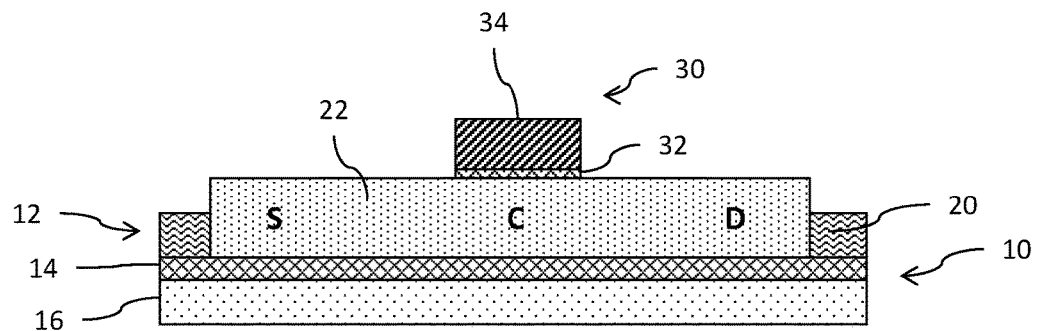

In the event that the active region 22 is formed as a fin structure, the gate stack 30 will straddle over the active region on three sides thereof at the channel region as shown in FIGS. 1C and 1D, rather than only the top side as shown in FIGS. 1A and 1B. The remaining process steps shown herein are equally applicable to the formation of a planar-type MOSFET device (as shown) or a finFET device, and thus the active region shall include configuration as either a planar active region (FIGS. 1A and 1B) or a fin structure active region (FIGS. 1C and 1D). Further illustration and description is made in the context of the structures shown in FIGS. 1A and 1B, but all further steps are equally applicable to the structures shown in FIGS. 1C and 1D.

In this context, it will be understood that the terms "width" and "length" are taken relative to the width and length of the channel of the transistor device being formed.

Figure 2:
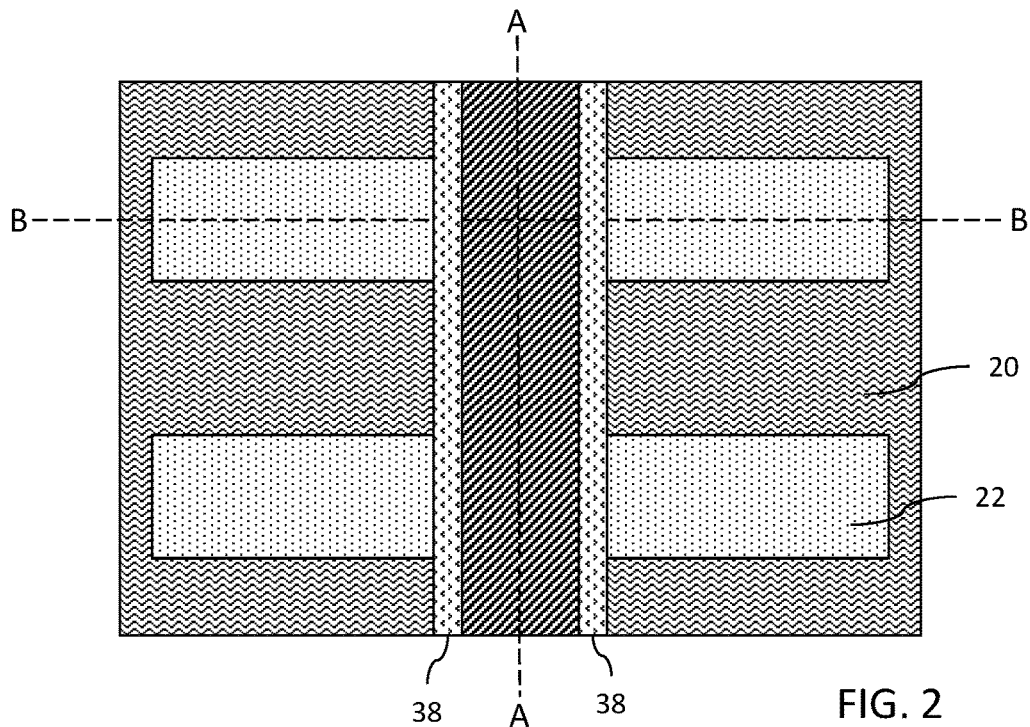
Figure 2A:
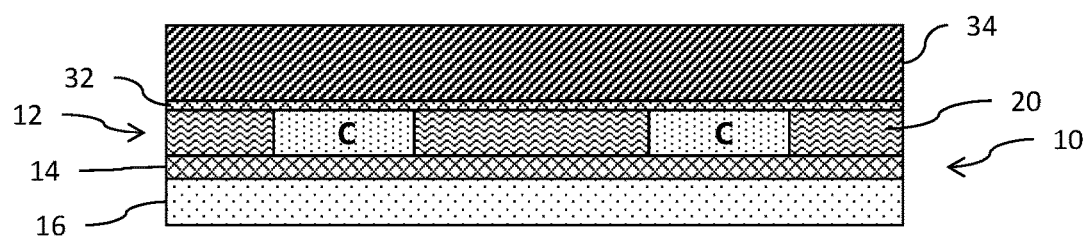
Figure 2B:
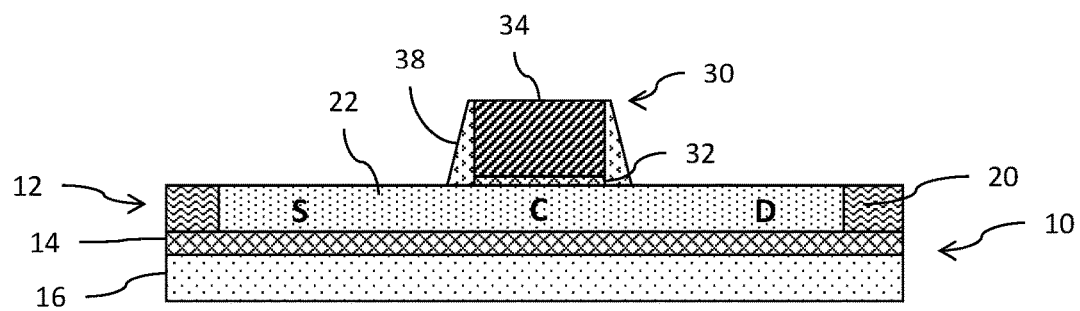

A sidewall spacer 38 is then formed on the sidewalls of the gate stack 30. The sidewall spacer 38 may, for example, be formed by a conformal deposit of an insulating material on the wafer followed by an etch which preferentially removes material on the horizontal surfaces of the wafer while leaving material on the vertical surfaces of the wafer. The insulating material for the sidewall spacer 38 may comprise: SiN, SiBCN or SiOCN. The sidewall spacer 38 may have a thickness of 1-20 nm. The process for spacer formation may, for example, use a Lam mixed mode pulsing (MMP) deposition/etch/$O_2$ flash approach. The result is shown in FIGS. 2, 2A and 2B. In this context, the sidewall spacer 38 is formed on first opposite sides of the gate stack 30.

Figure 3:
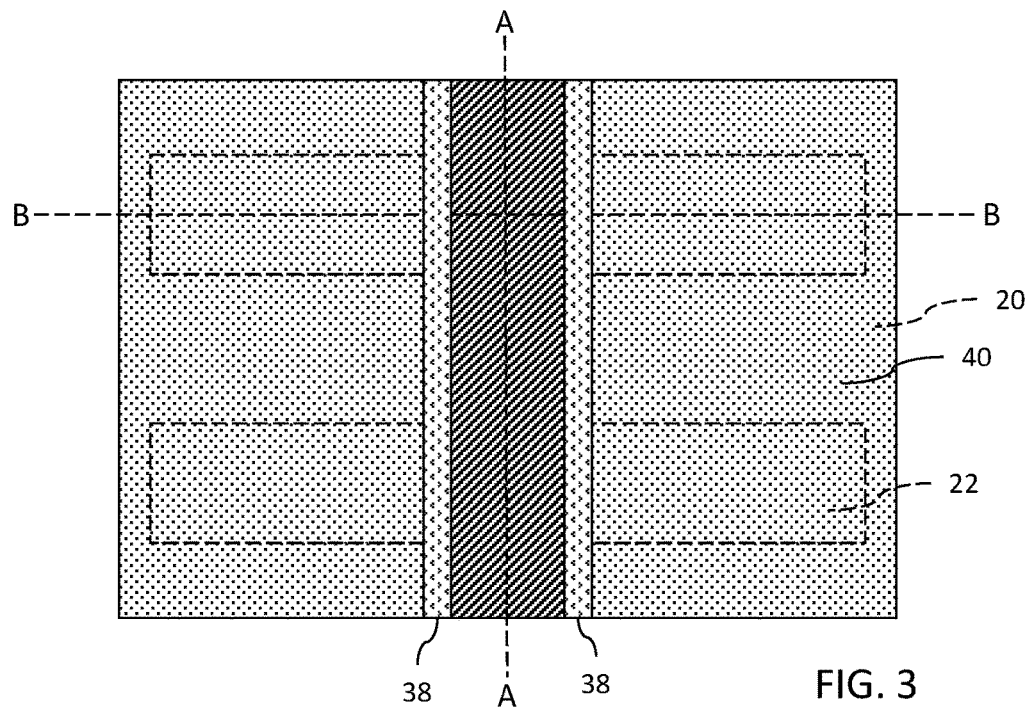
Figure 3A:
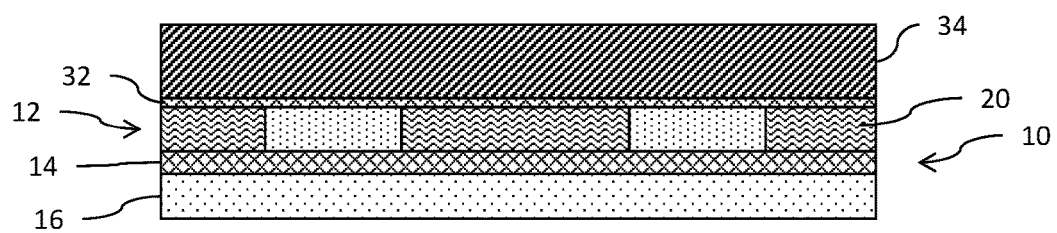
Figure 3B:
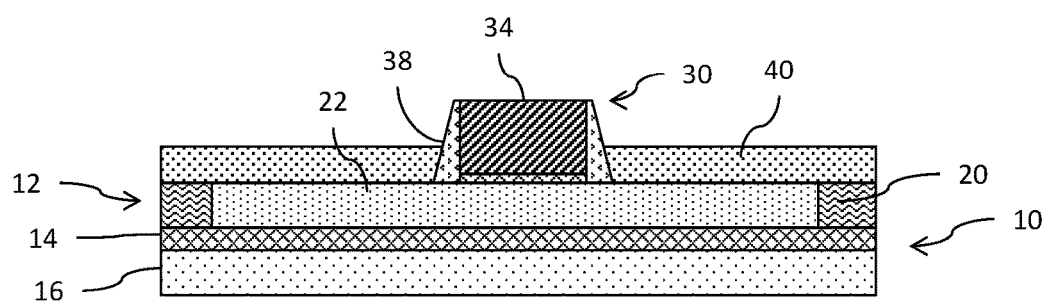

An epitaxial process is then used to grow an epitaxial layer 40 of semiconductor material on the wafer. The layer 40 may, for example, have a thickness of 20-60 nm, where that thickness is preferably less than the height of the gate stack 30, and more preferably about 30-40% of the height of the gate stack 30. The result is shown in FIGS. 3, 3A and 3B. If the transistors being produced are of the nMOS type, the material of the epitaxial layer 40 may, for example, comprise SiP/Si with a Phosphorus dopant concentration of $1 \times 10^{19}$ at/cm$^3$ to $1 \times 10^{21}$ at/cm$^3$. The material may include substitutional Carbon at 0.5% to 5%. If the transistors being produced are of the pMOS type, the material of the epitaxial layer 40 may, for example, comprise SiGeB with a Boron dopant concentration of $1\times10^{19}$ at/cm$^3$ to $2\times10^{21}$ at/cm$^3$. The material may include substitutional Germanium at 25% to 75%.

Figure 4:
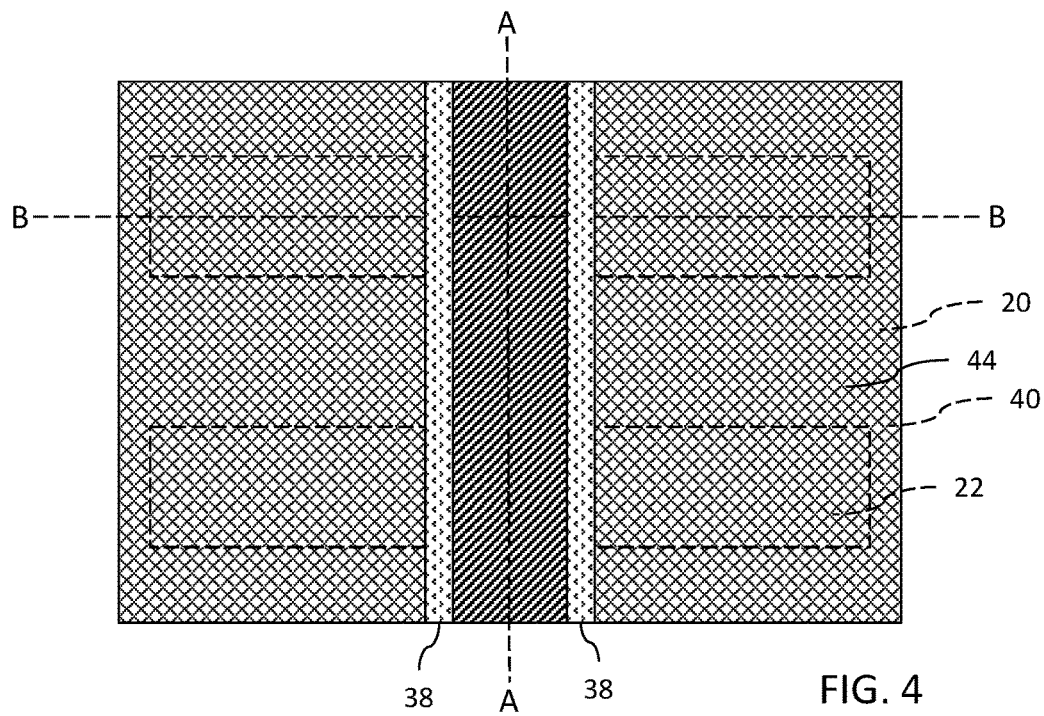
Figure 4A:
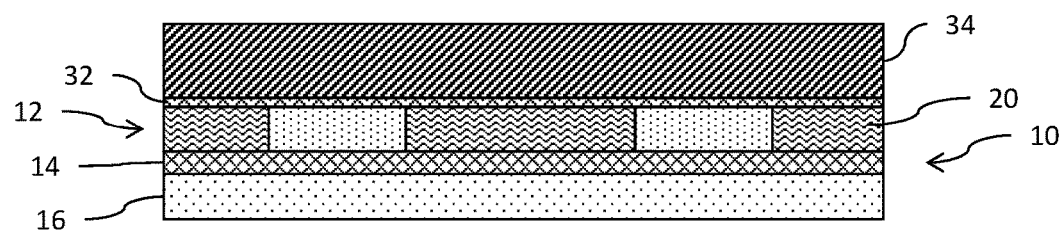
Figure 4B:
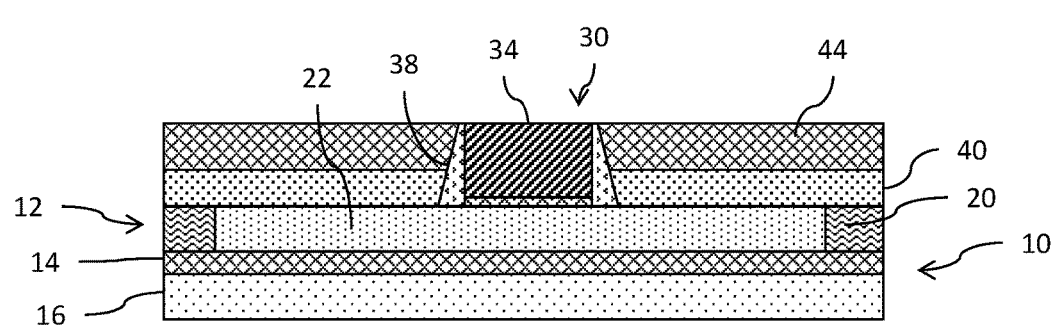

A sacrificial layer 44 (thickness 400-600 nm) of a dielectric material is then conformally deposited on the wafer to a thickness sufficient to cover the gate stack 30. A chemical mechanical polishing is then performed to remove the portions of the layer 44 above the top of the gate stack 30. The result is shown in FIGS. 4, 4A and 4B. The dielectric material of the layer 44 may, for example, comprise low temperature oxide or a flowable oxide deposited using chemical vapor deposition (CVD) or plasma-enhanced chemical vapor deposition (PECVD).

Figure 5:
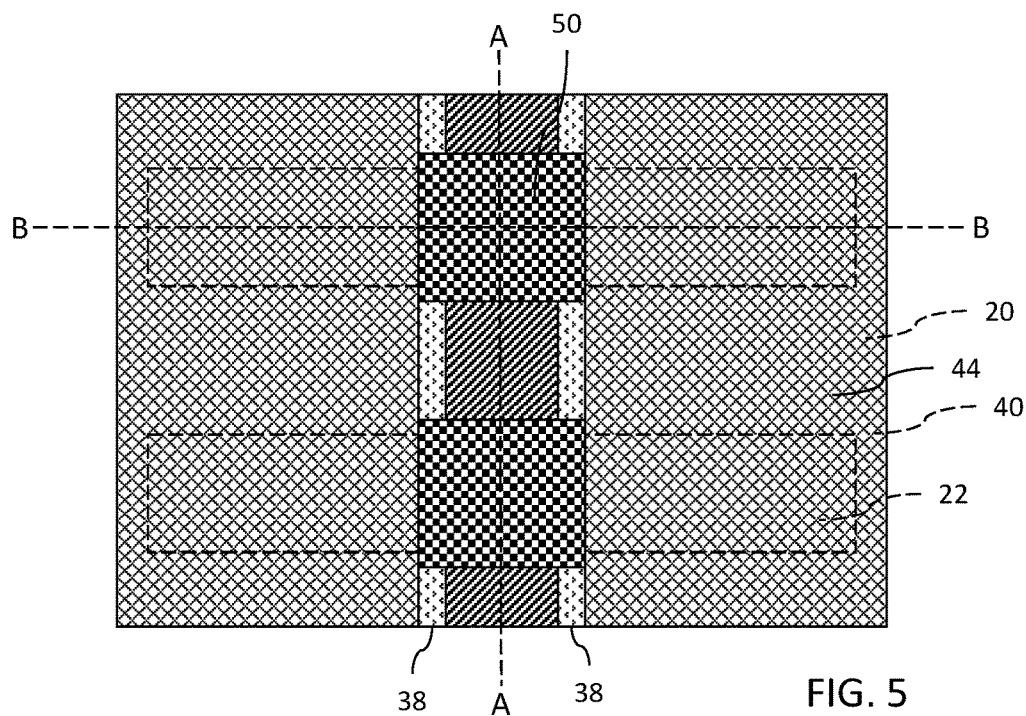
Figure 5A:
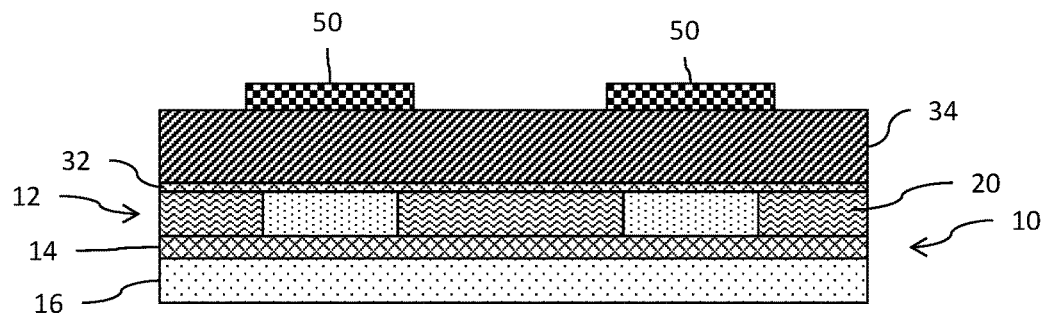
Figure 5B:
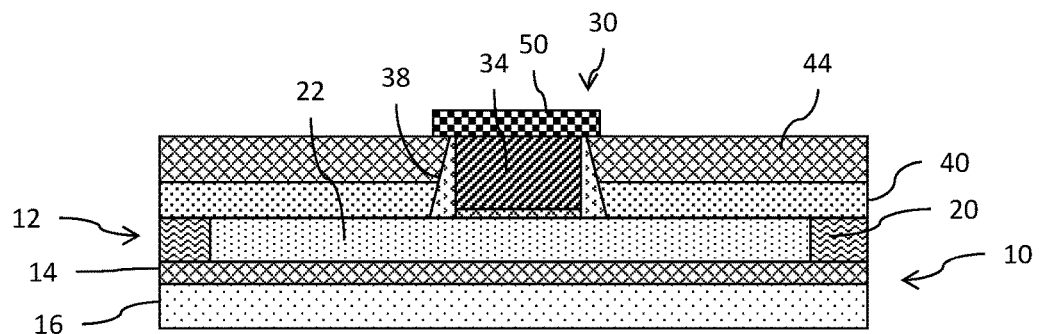

A layer of hard mask material is then deposited over the wafer. The hard mask material may, for example, comprise SiON deposited using PECVD. Using conventional lithographic techniques, the layer of hard mask material is patterned to leave a gate mask 50 over each region of the wafer where the gate stack 30 crosses (intersects) the active region 22. The result is shown in FIGS. 5, 5A and 5B.

Figure 6:
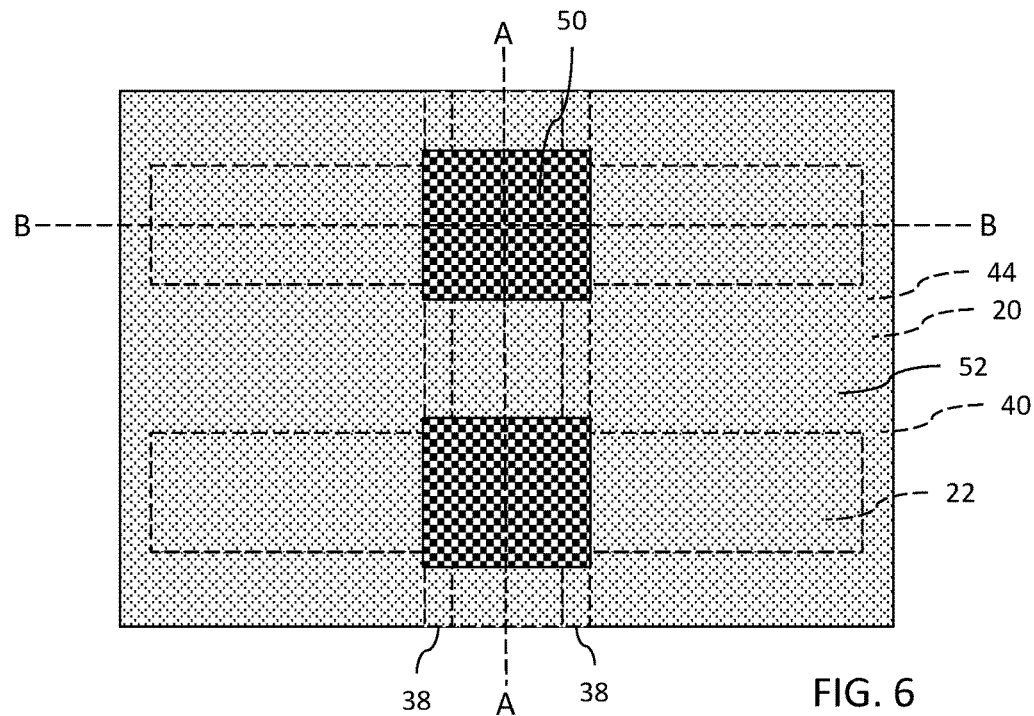
Figure 6A:
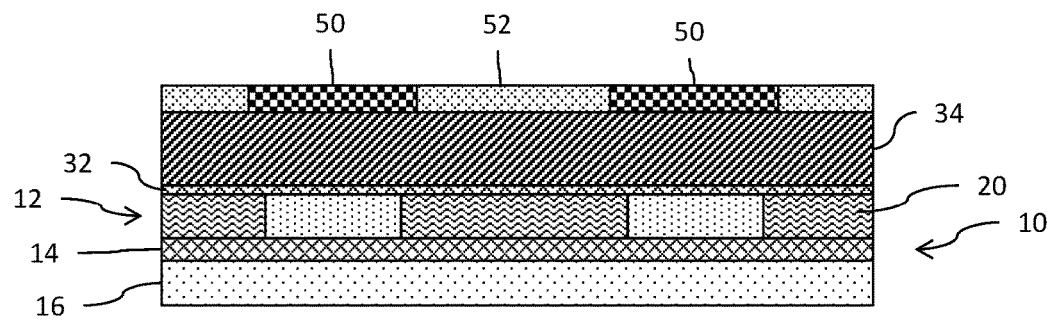
Figure 6B:
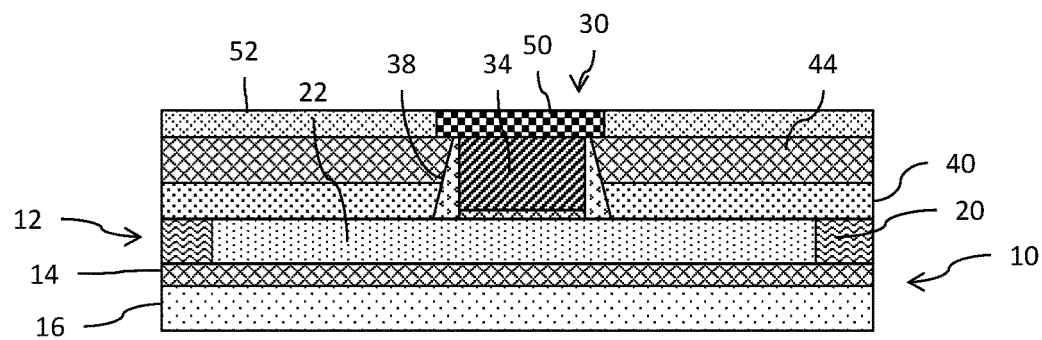

An additional layer 52 (thickness about 80 nm) of hard mask material is then conformally deposited on wafer to a thickness sufficient to cover the gate mask 50. A chemical mechanical polishing is then performed to remove the portions of the layer 52 above the top of the gate mask 50. The result is shown in FIGS. 6, 6A and 6B. The additional hard mask material may, for example, comprise amorphous carbon.

Figure 7:
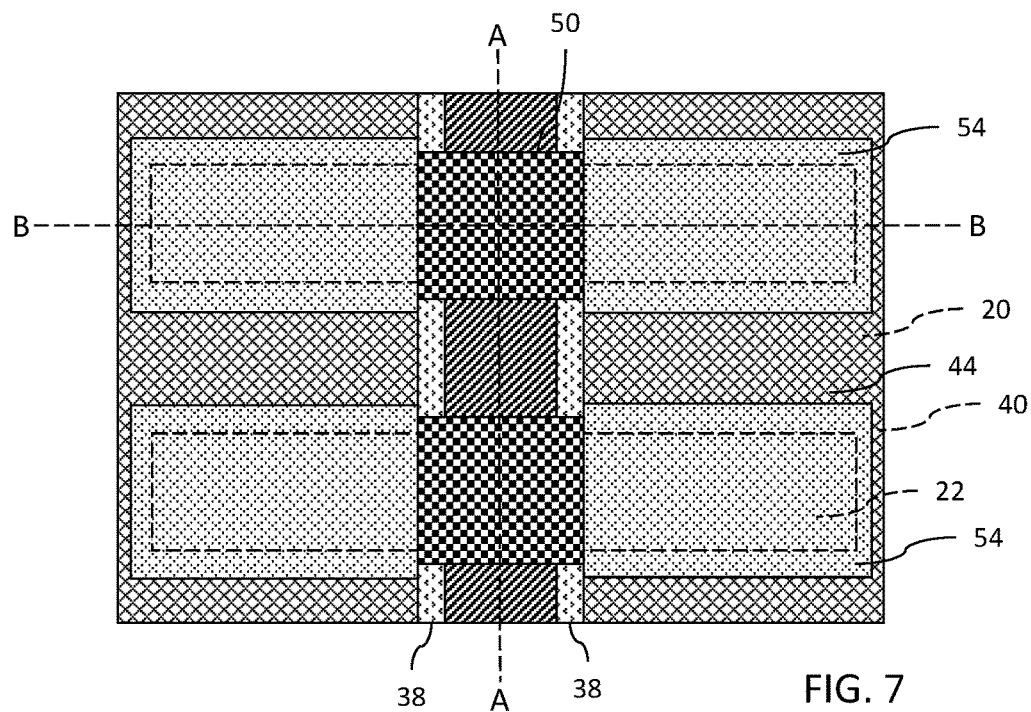
Figure 7A:
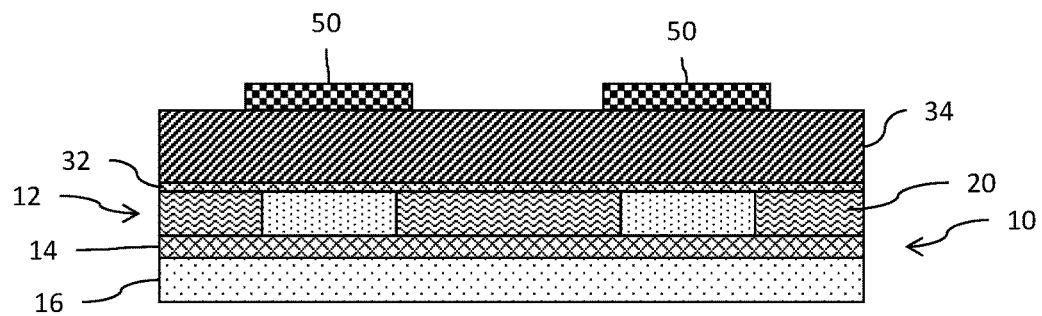
Figure 7B:
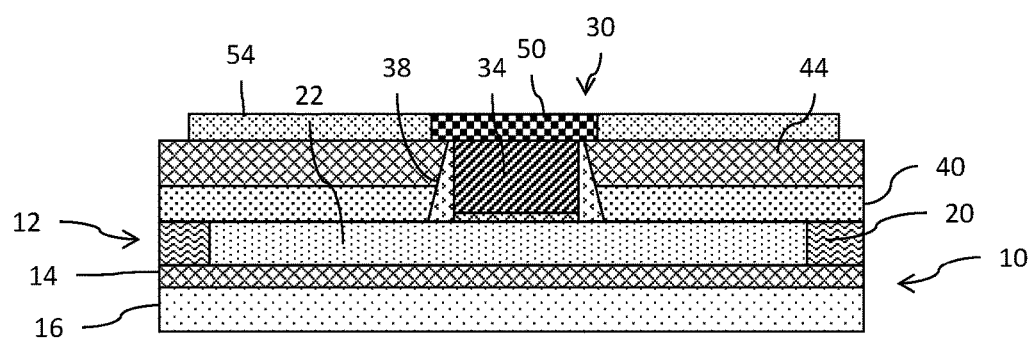

Using lithographic techniques known in the art, the additional layer 52 is patterned to define a mask 54 that covers the active regions 22 and areas of the wafer adjacent the active regions. The result is shown in FIGS. 7, 7A and 7B.

Figure 8:
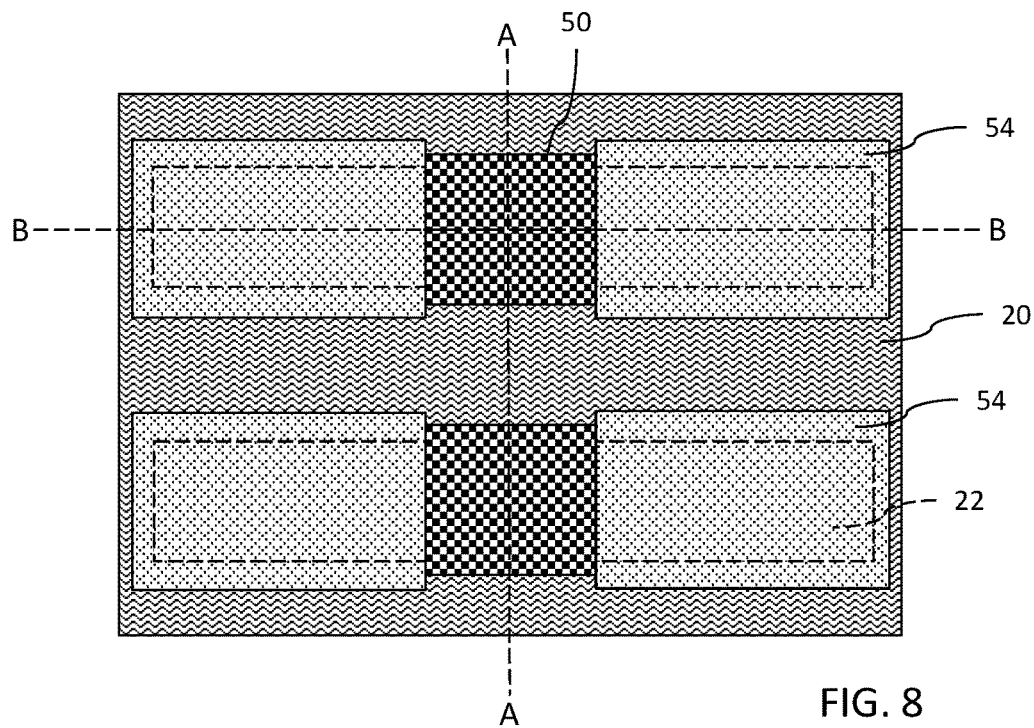
Figure 8A:
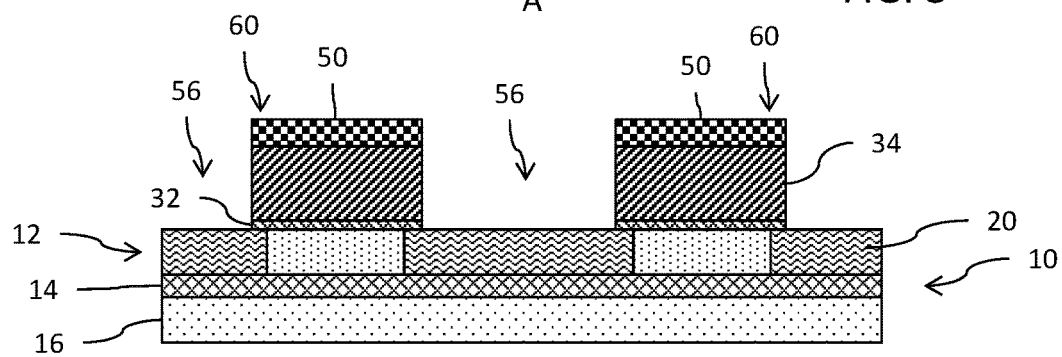
Figure 8B:
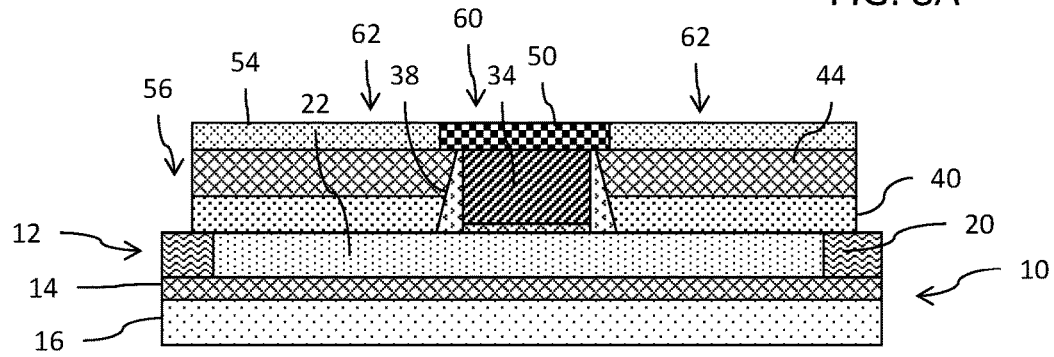

An etch is then performed using the masks 50 and 54 to block material removal. The etch extends through the various layers 40 and 44 to reach the top of the STI structures 20 and form openings 56. The result is shown in FIGS. 8, 8A and 8B. The etch process may, for example, comprise carbonyl sulfide (COS) added to oxygen as the additive etch gas etching of the amorphous carbon layers selective to SiON in the reactive ion etch (ME). Florin-based anisotropic ME can be used to stop on the STI structures 20. The result of the etch leaves a separate gate stack 60 over each active region 22 and a source-drain stack 62 over each active region 22 on either side of the separate gate stack 60.

Figure 9:
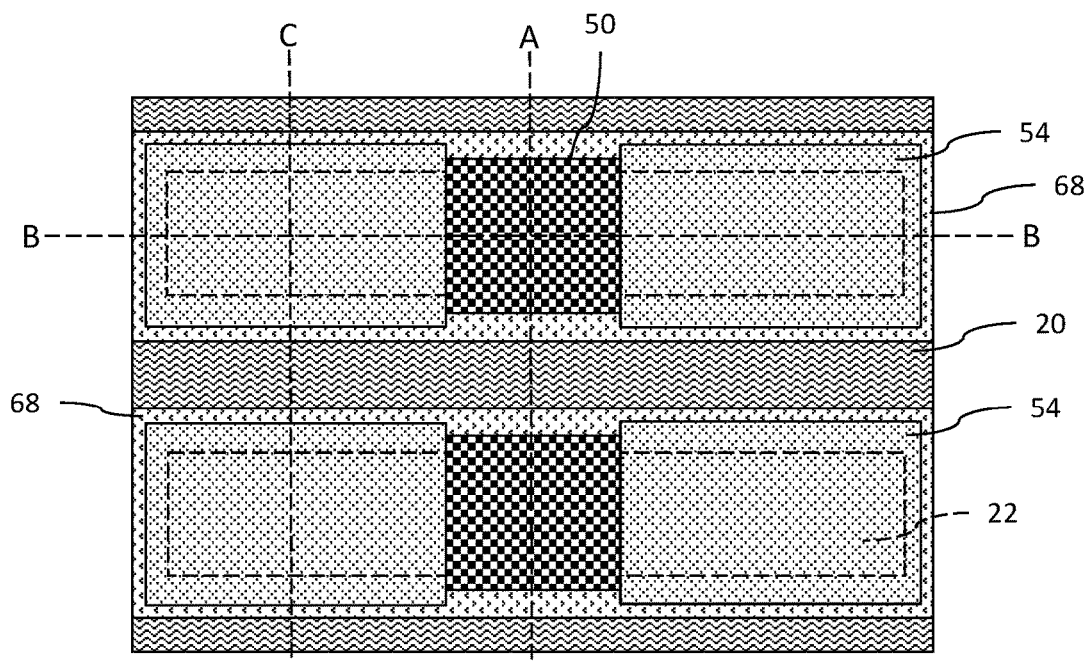
Figure 9A:
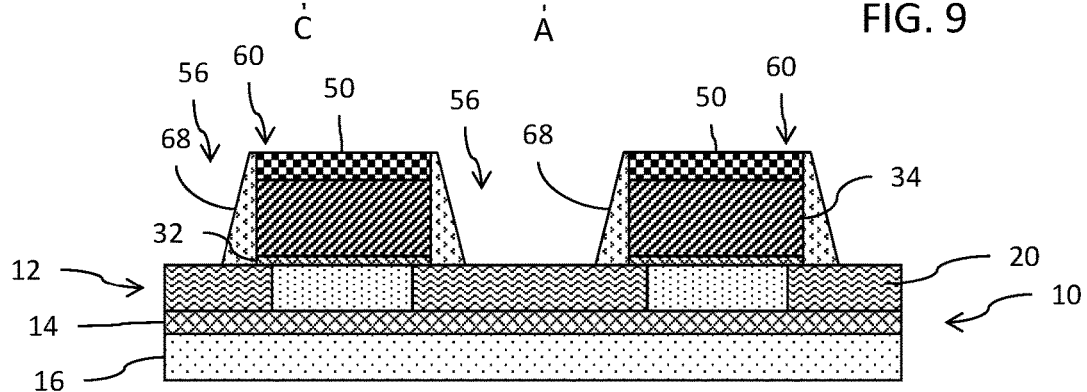
Figure 9B:
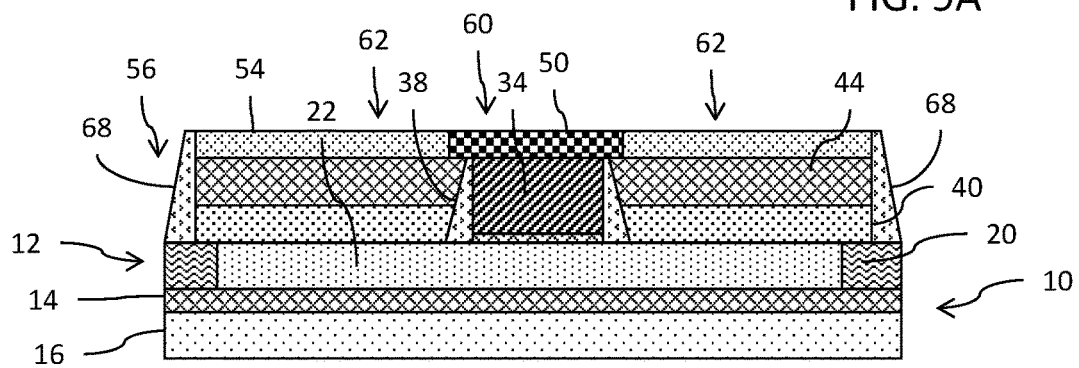
Figure 9C:
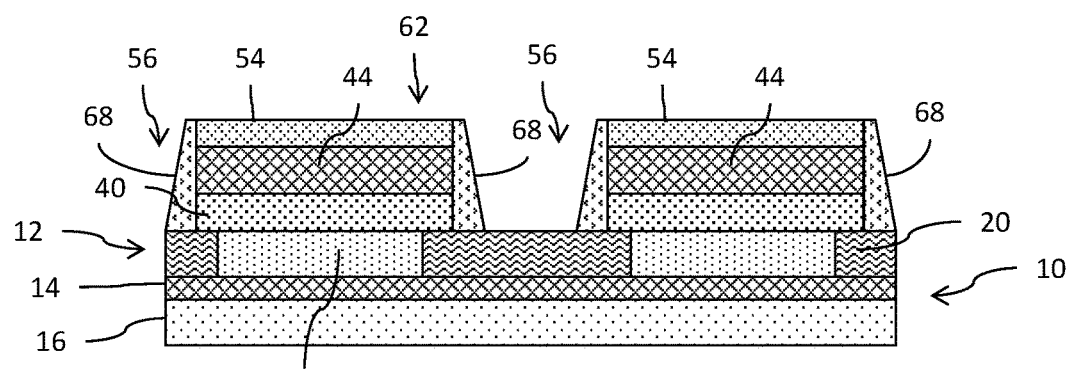

A sidewall spacer 68 is then formed on the sidewalls of the separate gate stack 60 and the newly exposed sidewalls of each separate source-drain stack 62. The sidewall spacer 68 may, for example, be formed by a conformal deposit of an insulating material on the wafer followed by an etch which preferentially removes material on the horizontal surfaces while leaving material on the vertical surface. The insulating material for the sidewall spacer 68 may comprise: SiN, SiBCN or SiOCN. The sidewall spacer 68 may have a thickness of 1-20 nm. The process for spacer formation may, for example, use a Lam mixed mode pulsing (MMP) deposition/etch/O$_2$ flash approach. The result is shown in FIGS. 9, 9A, 9B and 9C (wherein FIG. 9C is a cross-section taken along line C-C of FIG. 9). In this context, the sidewall spacer 68 is formed on second opposite sides of the separate gate stack 60, with the sidewall spacer 38 formed on the first opposite sides of the gate stack 30, and the sidewall spacers 38 and 68 peripherally surrounding the separate gate stack 60 and each source-drain stack 62.

Figure 10:
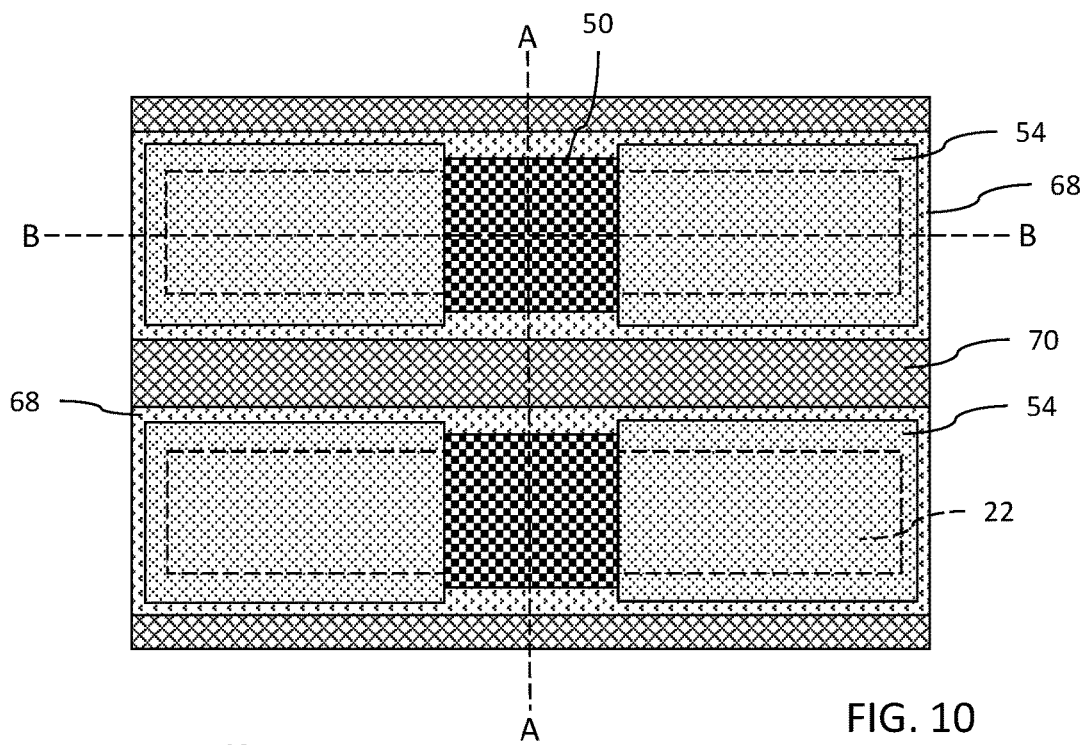
Figure 10A:
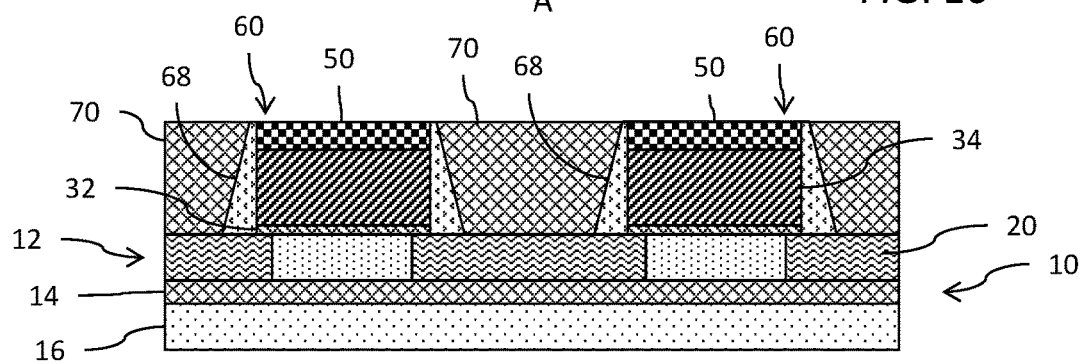
Figure 10B:
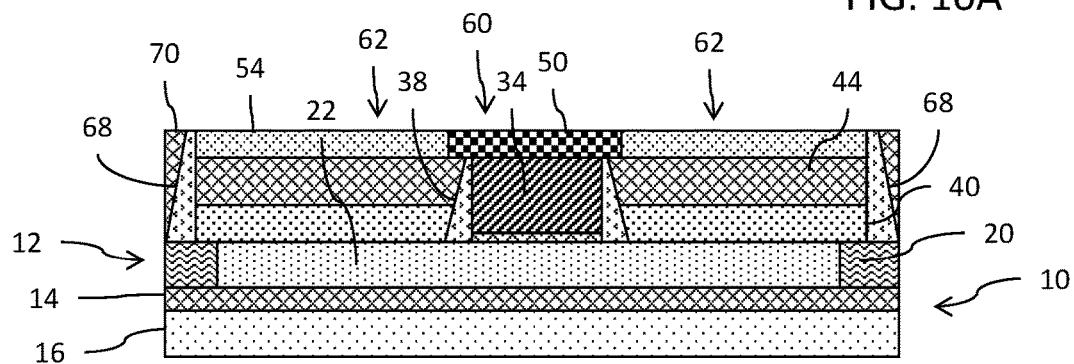
Figure 11:
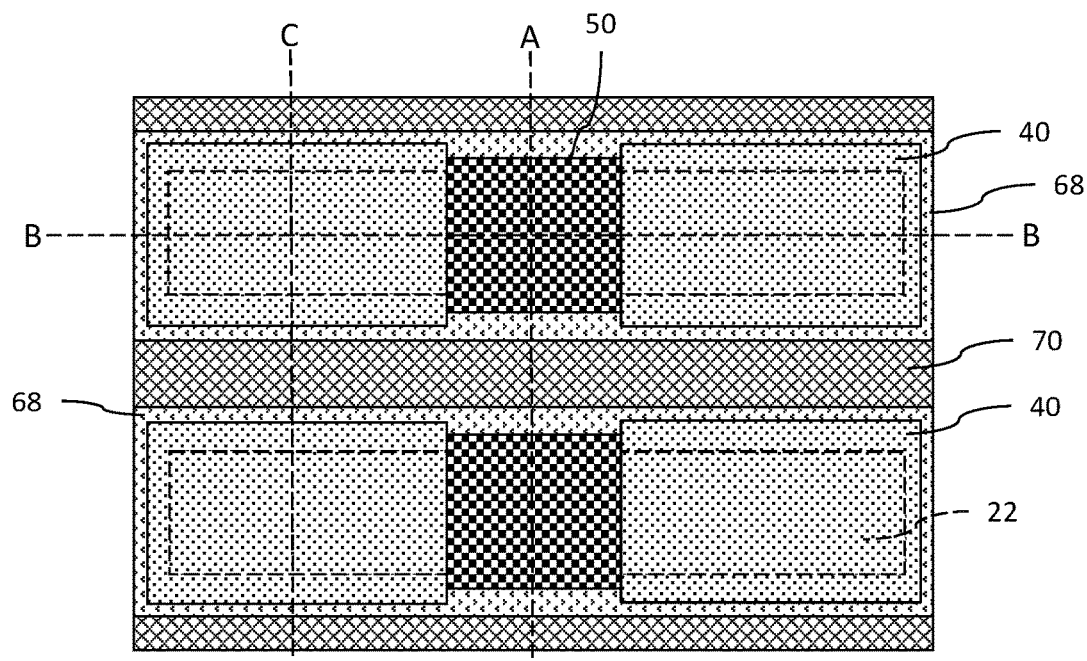
Figure 11A:
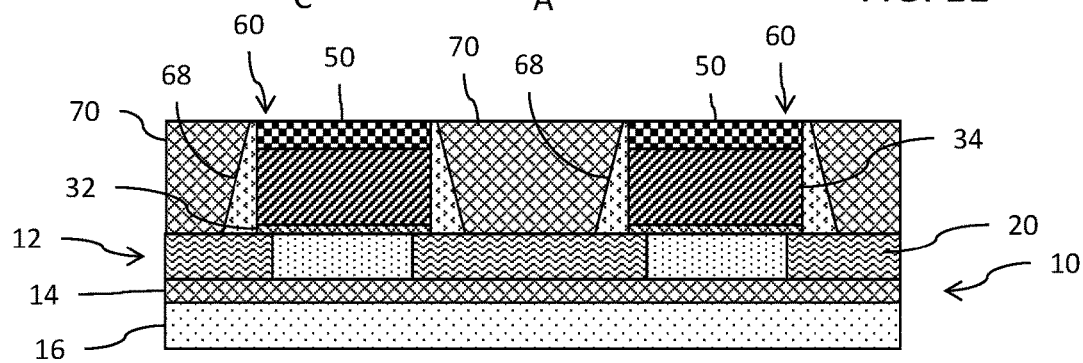
Figure 11B:
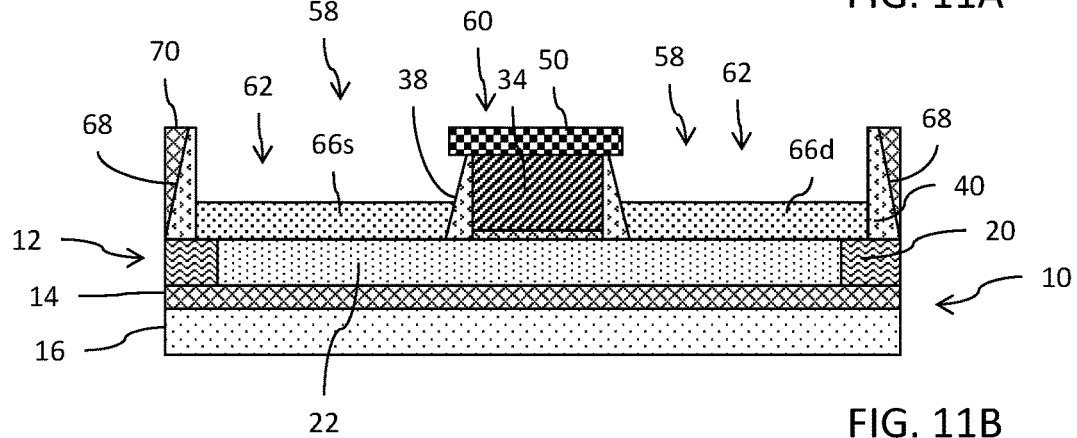

A layer 70 (thickness 400-600 nm) of a dielectric material is then conformally deposited on wafer within the openings 56 to a thickness sufficient to cover the masks 50 and 54. A chemical mechanical polishing is then performed to remove the portions of the layer 70 above the top of the masks 50 and 54. The result is shown in FIGS. 10, 10A and 10B. The dielectric material of the layer 70 may, for example, comprise an oxide deposited using chemical vapor deposition (CVD) or plasma-enhanced chemical vapor deposition (PECVD).

Figure 11C:
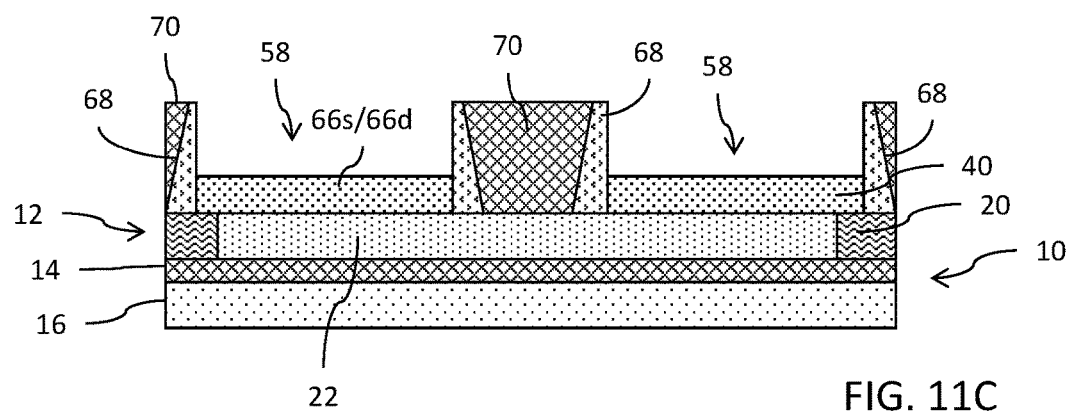

The mask 54 is then selectively removed and an etch is performed through the opening left by removal of the mask 54 to remove the oxide layer 44 stopping on the epitaxial layer 40 and forming openings 58 which are laterally delimited by the sidewall spacer 38 on the gate stack 30 and the sidewall spacer 68 surrounding the source-drain stack 62. The result is shown in FIGS. 11, 11A, 11B and 11C (wherein FIG. 11C is a cross section taken along line C-C of FIG. 11). The etch process may, for example, comprise carbonyl sulfide (COS) added to oxygen as the additive etch gas etching of the amorphous carbon layers selective to SiON in the reactive ion etch (RIE). The result of the etch leaves the separate gate stacks 60 over each active region 22 as well as the epitaxial layer 40 of the source-drain stacks 62 over each active region 22 on either side of the separate gate stack 60. In this regard, a source region 66s is provided on one side of the separate gate stack 60 and a drain region 66d is provided on the other side of the separate gate stack 60.

Figure 12:
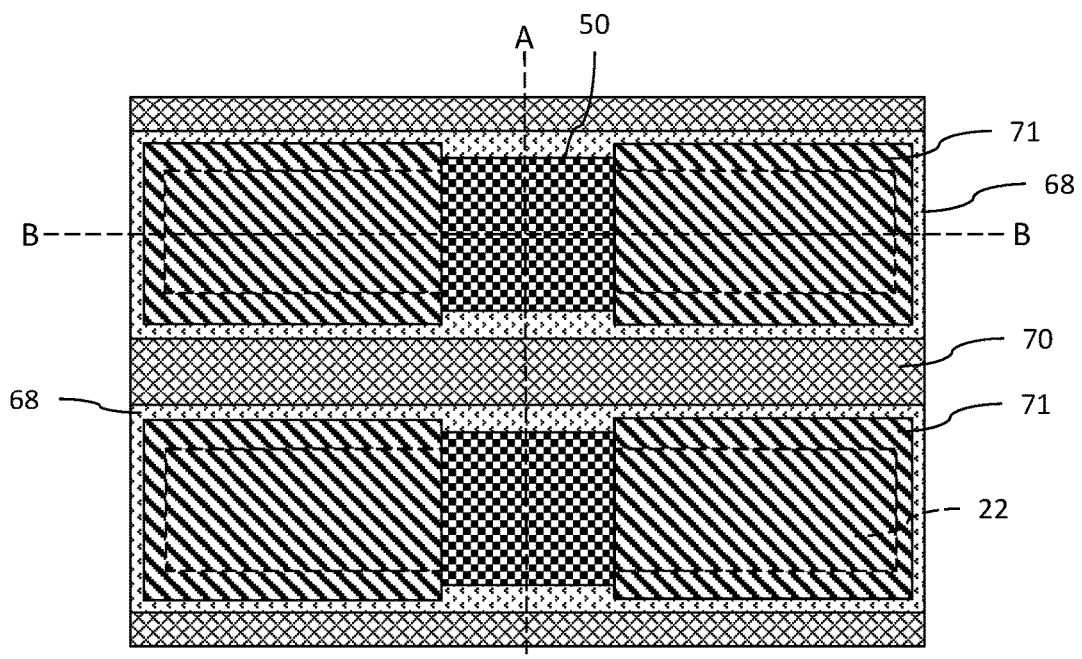
Figure 12A:
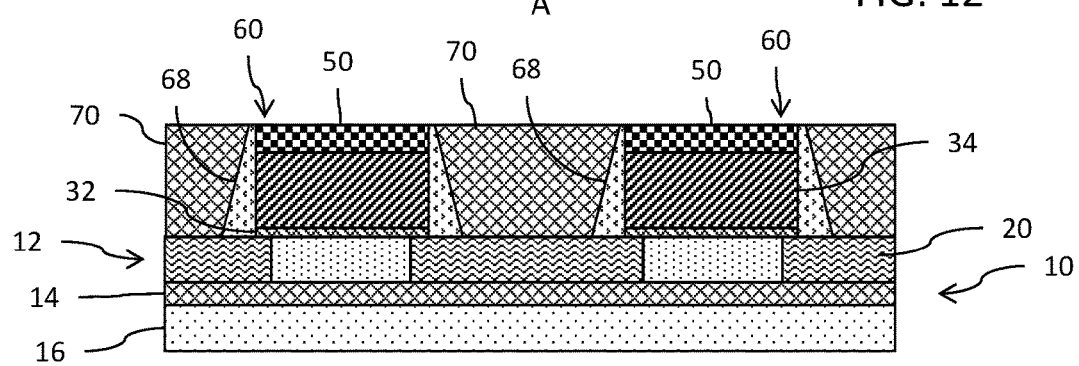
Figure 12B:
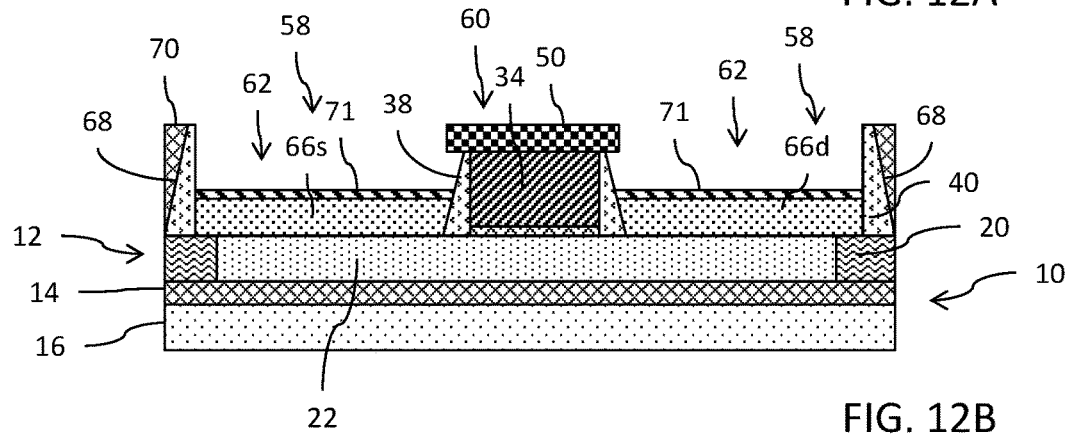

The top surfaces of the source region 66s and drain region 66d in each opening 58 are then converted to a silicide 70. The result is shown in FIGS. 12, 12A and 12B. Techniques for forming silicides are well known to those skilled in the art. In an implementation for a relatively large (greater than or equal to 20 nm) critical dimension process, the following silicide process may be used: a SiCoNi preclean, a deposit of a NiPt layer using RFPVD, and an anneal at 380° C. for 30 seconds. For a relatively small (less than 20 nm) critical dimension, the following silicide process may be used for nMOS transistor devices: a gas cluster ion beam (GCIB)/dHF preclean, a trench epitaxial layer of SiP with a Phosphorous amorphous implant ($1\times10^{19}$ at/cm$^3$ to $1\times10^{21}$ at/cm$^3$) and anneal, a deposit of a Ti layer by PVD, and a laser anneal. For a relatively small (less than 20 nm) critical dimension, the following silicide process may be used for pMOS transistor devices: a gas cluster ion beam (GCIB)/dHF preclean, a trench epitaxial layer of GeB with a Boron amorphous implant $1\times10^{19}$ at/cm$^3$ to $2\times10^{21}$ at/cm$^3$) and anneal, a deposit of a Ti layer by PVD, and a laser anneal.

Figure 13:
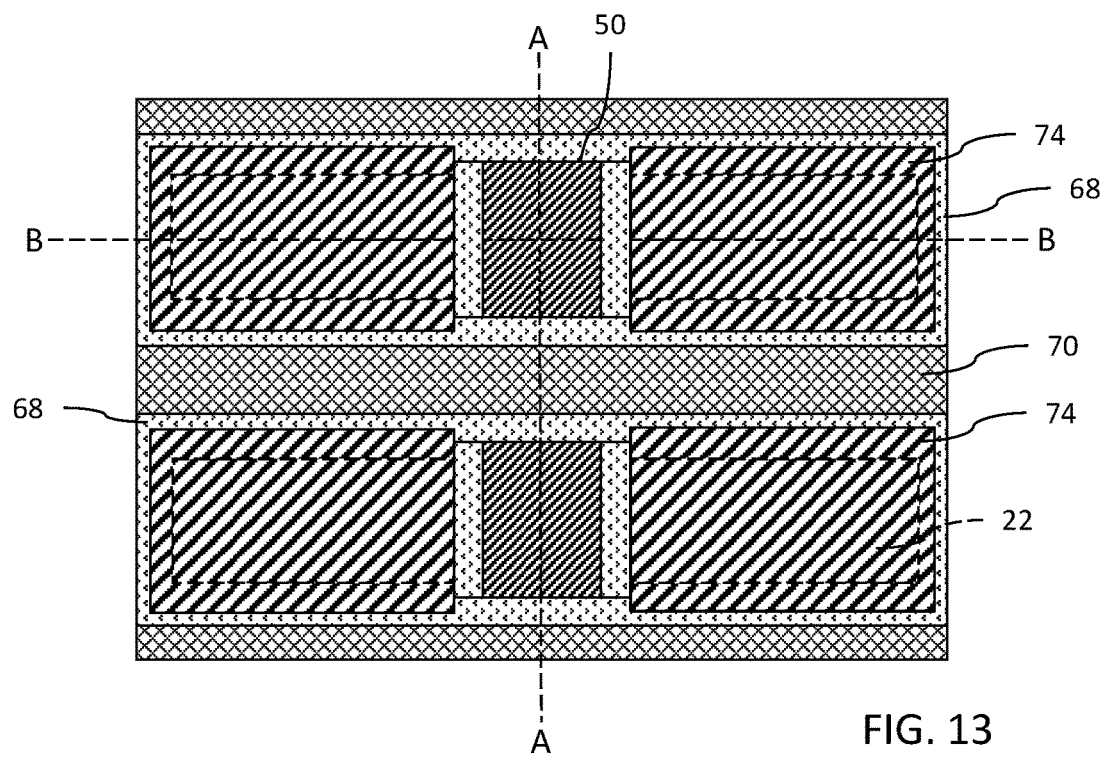
Figure 13A:
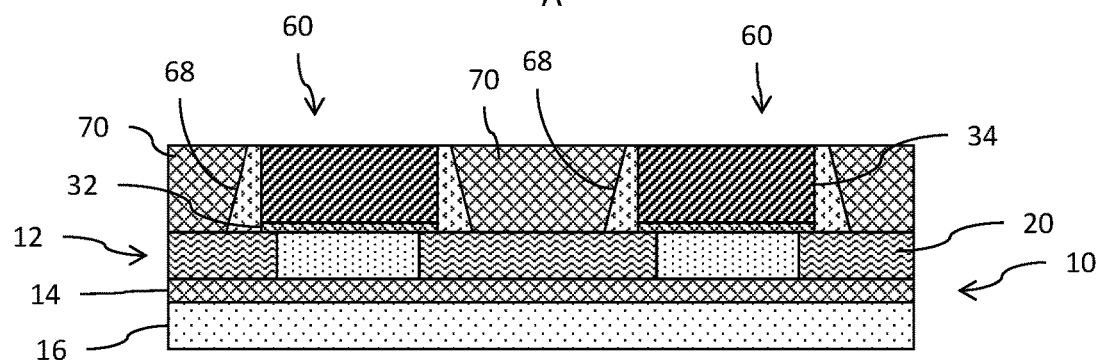
Figure 13B:
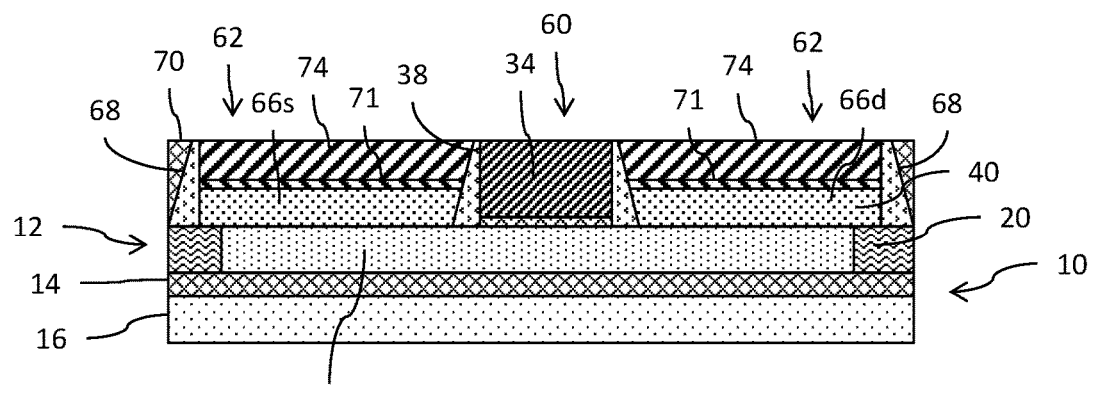

A metal contact 74 for each of the source and drain is then formed within the openings 58 over the silicide 70. The metal contact 74 is preferably formed by a barrier layer (3-5 nm ALD of Ti), a liner (2-4 nm ALD of TiN) and metal fill (200 nm CVD of W, Co, Cu, Al or alloys thereof). A chemical mechanical polishing is then performed to remove the portions of the layer, liner and fill of the metal contact 74 above the top of the separate gate stacks 60. The gate mask 50 is also removed. The result is shown in FIGS. 13, 13A and 13B.

Figure 14:
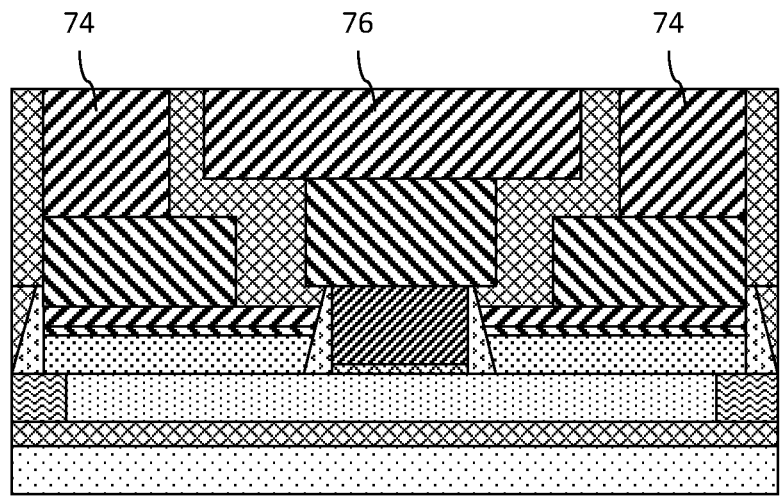
Figure 15:
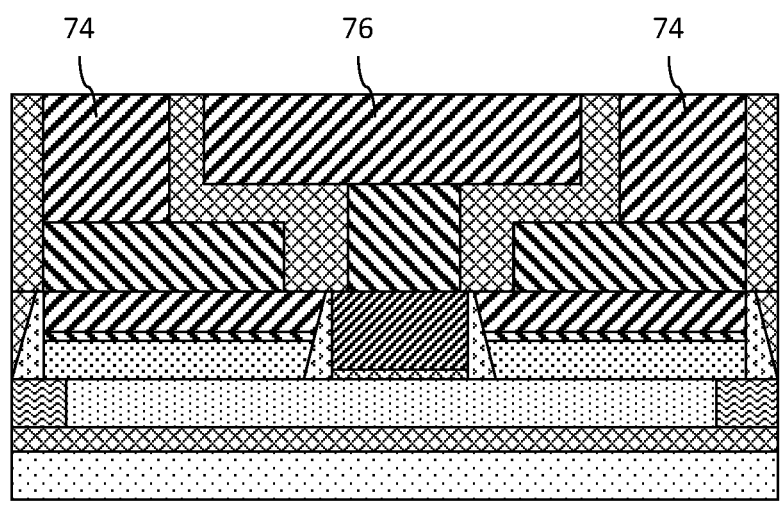

Conventional middle of line (MOL) and back-end of line (BEOL) processes may then be used to form extensions of the metal contacts 74 for the source and drain as well as a metal contact 76 for the gate. Examples of structural configurations for the MOL/BEOL structures are shown in FIGS. 14 and 15.

In the implementation described above, the gate stack 30 may comprise a fully formed gate electrode for the transistor device in a manner consistent with the "gate-first" fabrication technique. In an alternative embodiment, the gate stack may instead comprise a "dummy" gate structure in a manner consistent with the "gate-last" (or replacement metal gate) fabrication technique. In the gate-last process, following the step of FIGS. 13, 13A and 13B, the process would next comprise removal of the materials 32/34 of the dummy gate structures to form an opening delimited by the sidewall spacer 38 and the sidewall spacer 68 that surround the dummy gate stack 30. This is followed by fabrication of the gate electrode in the opening by, for example, deposition of a high-K dielectric material to cover the channel region, deposition of a work function metal and deposition of a polysilicon or metal electrode material. In either the gate-first or gate-last technique, the gate electrode may further include a silicide region.

While the invention has been illustrated and described in detail in the drawings and foregoing description, such illustration and description are considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims.

What is claimed is:

1. A method, comprising:
    forming an intermediate transistor structure including:
        a gate structure having a first vertical dielectric spacer on a first sidewall of the gate structure and having a second vertical dielectric spacer on a second sidewall of the gate structure,
        a source region adjacent the gate structure such that at least part of the first vertical dielectric spacer is located between the source region and the gate structure; and
        a drain region adjacent the gate structure such that at least part of the second vertical dielectric spacer is located between the source region and the gate structure;
        wherein the top surface of the gate structure is at a level that is higher than and not coplanar with a top surface of the source region and a top surface of the drain region;
    forming a sacrificial layer over the source region and the drain region so that a top surface of the sacrificial layer is substantially coplanar with the top surface of the gate structure;
    forming a gate structure block mask over a portion of the gate structure, such that the gate structure block mask is not over at least a majority of the source region and the drain region;
    forming a source/drain mask over the source region and the drain region adjacent the gate structure block mask;
    while forming the source/drain mask, exposing a third sidewall and a fourth sidewall of the gate structure, wherein the third and fourth sidewalls are not parallel to nor aligned with the first and second sidewalls of the gate structure;
    forming a third vertical dielectric spacer on any exposed sidewalls of the source region, on any exposed sidewalls of the drain region, on the third sidewall of the gate structure, and on the fourth sidewall of the gate structure;
    selectively removing the source/drain mask;
    selectively removing the sacrificial layer remaining on the source and drain regions;
    forming source and drain contact structures on the source and drain regions at the locations where the remaining sacrificial layer was removed.

2. The method of claim 1, wherein the sacrificial layer is made of a dielectric material.

3. The method of claim 2, wherein forming the sacrificial layer comprises chemical vapor depositing of the sacrificial layer.

4. The method of claim 2, wherein the sacrificial layer has a thickness between 400 nm and 600 nm.

5. The method of claim 2, wherein forming the sacrificial layer comprises plasma enhanced chemical vapor depositing of the sacrificial layer.

6. The method of claim 1, wherein the gate structure block mask is made of SiON.

7. The method of claim 6, wherein forming the gate structure block mask comprises plasma enhanced chemical vapor depositing of the gate structure block mask.

8. The method of claim 6, wherein the gate structure block mask has a thickness that is less than 80 nm.

9. The method of claim 1, wherein the source/drain mask is made of an amorphous carbon-based material.

10. The method of claim 9, wherein forming the source/drain mask comprises plasma enhanced chemical vapor depositing of the source/drain mask.

11. The method of claim 10, wherein an initial thickness the source/drain mask is greater than a thickness of the gate structure block mask.

12. The method of claim 11, forming the source/drain mask further comprises planarizing the source/drain mask to a level substantially coplanar with a top surface of the gate structure block mask.

13. The method of claim 1, wherein forming the source and drain contact structures comprises locating the source and drain contact structures within a boundary formed by the first, second and third vertical dielectric spacers.

14. The method of claim 1, further comprising siliciding a top of the source and drain regions.

15. A method, comprising:
    forming a gate structure that includes a first sidewall and a second sidewall;
    forming a first vertical dielectric spacer on the first sidewall and a second vertical dielectric spacer on the second sidewall;
    forming a source region adjacent the gate structure with at least part of the first vertical dielectric spacer located between the source region and the gate structure;
    forming a drain region adjacent the gate structure with at least part of the second vertical dielectric spacer located between the source region and the gate structure;
    providing a sacrificial layer over the source region and the drain region, the sacrificial layer having a top surface that is substantially coplanar with a top surface of the gate structure and the first and second vertical dielectric spacers;
    forming a gate structure block mask that extends over the gate structure and the first and second vertical dielectric spacers;
    forming a source/drain mask on the dummy layer over the source region and the drain region adjacent the gate structure block mask;
    while forming the source/drain mask, exposing a third sidewall and a fourth sidewall of the gate structure, wherein the third and fourth sidewalls are not parallel to nor aligned with the first and second sidewalls of the gate structure;
    forming a third vertical dielectric spacer on any exposed sidewalls of the source region, on any exposed sidewalls of the drain region, on any exposed sidewalls of the source/drain mask, on any exposed sidewalls of the gate structure block mask, on the third sidewall of the gate structure, and on the fourth sidewall of the gate structure;

selectively removing the source/drain mask and the sacrificial layer to form openings over the source and drain regions that are delimited by the first, second and third vertical dielectric spacers; and filling said openings with a conductive material to form source and drain contact structures.

16. The method of claim 15, further comprising siliciding a top of the source and drain regions in said openings.

17. A method, comprising:

forming an intermediate transistor structure including:
an active region supported by a substrate and including a source region, a channel region and a drain region; and
a gate stack over the channel region;

forming a first sidewall spacer on sidewalls of the gate stack;

epitaxially growing a raised source region and a raised drain region over the source and drain regions, respectively, of the active region and adjacent the first sidewall spacer;

depositing a sacrificial layer over the raised source region and raised drain region to form a source stack and a drain stack, respectively;

forming a second sidewall spacer on further sidewalls of the gate stack and which peripherally surrounds the source stack and drain stack;

selectively removing the sacrificial layer to form openings above the raised source region and raised drain region that are each delimited by the first and second sidewall spacers; and filling said openings with conductive material to form a source contact and a drain contact to the raised source region and raised drain region, respectively.

18. A method, comprising:

forming an intermediate transistor structure including:
an active region supported by a substrate and including a source region, a channel region and a drain region; and
a gate stack over the channel region;

forming a first sidewall spacer on first sidewalls of the gate stack;

forming a raised source region and a raised drain region over the source and drain regions, respectively, of the active region and adjacent the first sidewall spacer;

depositing a sacrificial layer over the raised source region and raised drain region;

forming a first mask over the gate stack;

forming a second mask over the sacrificial layer and the raised source region and raised drain region;

etching using the first and second masks to define a source stack and drain stack covered by said second mask and expose second sidewalls of the gate stack;

forming a second sidewall spacer on the second sidewalls and which surrounds the source stack and drain stack;

removing the second mask;

etching using the first mask to remove the sacrificial layer and form openings above the raised source region and raised drain region which are delimited by the first and second sidewall spacers; and filling said openings with conductive material to form a source contact and a drain contact to the raised source region and raised drain region, respectively.

* * * * *

UNITED STATES PATENT AND TRADEMARK OFFICE
CERTIFICATE OF CORRECTION

PATENT NO. : 10,312,261 B2
APPLICATION NO. : 15/890910
DATED : June 4, 2019
INVENTOR(S) : John Hongguang Zhang Page 1 of 1

It is certified that error appears in the above-identified patent and that said Letters Patent is hereby corrected as shown below:

In the Specification

At Column 5, Line 40, please replace the term [[ (ME) ]] with -- (RIE) --

At Column 5, Line 41, please replace the term [[ ME ]] with -- RIE --

Signed and Sealed this
Twenty-fifth Day of February, 2020

Andrei Iancu
*Director of the United States Patent and Trademark Office*